(12) United States Patent
Lai et al.

(10) Patent No.: US 11,388,827 B2
(45) Date of Patent: Jul. 12, 2022

(54) FIXING STRUCTURE FOR ELECTRONIC DEVICE

(71) Applicants: LITE-ON ELECTRONICS (GUANGZHOU) LIMITED, Guangzhou (CN); LITE-ON TECHNOLOGY CORPORATION, Taipei (TW)

(72) Inventors: Ming-Huei Lai, Taipei (TW); Che-Cheng Chang, Taipei (TW); Jian-Lun Chen, Taipei (TW)

(73) Assignees: LITE-ON ELECTRONICS (GUANGZHOU) LIMITED; LITE-ON TECHNOLOGY CORPORATION

( * ) Notice: Subject to any disclaimer, the term of this patent is extended or adjusted under 35 U.S.C. 154(b) by 76 days.

(21) Appl. No.: 17/092,011

(22) Filed: Nov. 6, 2020

(65) Prior Publication Data

US 2021/0210833 A1 Jul. 8, 2021

Related U.S. Application Data

(60) Provisional application No. 62/956,360, filed on Jan. 2, 2020.

(51) Int. Cl.
| | | |
|---|---|---|
| *F16M 11/00* | (2006.01) | |
| *H05K 5/06* | (2006.01) | |
| *G01R 29/10* | (2006.01) | |
| *H04B 17/11* | (2015.01) | |
| *H04B 17/27* | (2015.01) | |
| *H01Q 3/00* | (2006.01) | |
| *H01Q 1/12* | (2006.01) | |
| *H04B 17/16* | (2015.01) | |

(Continued)

(52) U.S. Cl.
CPC ............. *H05K 5/069* (2013.01); *F16M 13/00* (2013.01); *G01R 29/105* (2013.01); *H01Q 1/1207* (2013.01); *H01Q 3/005* (2013.01); *H04B 17/11* (2015.01); *H04B 17/16* (2015.01); *H04B 17/27* (2015.01); *H05K 5/0204* (2013.01)

(58) Field of Classification Search
CPC ........ H04B 17/11; H04B 17/16; F16M 13/00; G01Q 1/1207; H01Q 3/005; H05K 5/0206
See application file for complete search history.

(56) References Cited

U.S. PATENT DOCUMENTS 2,710,161 A * 6/1955 Haberstump ............. B60R 1/06
248/221.12
4,603,829 A * 8/1986 Koike ................... H05K 5/0204
248/657

(Continued)

*Primary Examiner* — Amy J. Sterling
(74) *Attorney, Agent, or Firm* — Innovation Counsel LLP

(57) ABSTRACT

A fixing structure for an electronic device includes a mounting body and a mounting bracket. The mounting body includes a side surface, a bottom surface, and at least one limiting member disposed on the bottom surface. The limiting member includes a fixed end and a pillar. The pillar extends downward from the fixed end and protrudes from the bottom surface. The mounting bracket includes a fixing plate and a release assembly. The fixing plate is disposed under the bottom surface of the mounting body, and the fixing plate and the pillar are buckled with each other. The release assembly is disposed on the fixing plate, and the release assembly abuts against the side surface of the mounting body.

10 Claims, 6 Drawing Sheets

(51) Int. Cl.
*F16M 13/00* (2006.01)
*H05K 5/02* (2006.01)

(56) References Cited

U.S. PATENT DOCUMENTS

| | | | | |
|---|---|---|---|---|
| 5,116,015 | A * | 5/1992 | Gassaway | E05B 73/0082 |
| | | | | 248/681 |
| 7,669,443 | B2 * | 3/2010 | Varner | E05B 73/00 |
| | | | | 109/51 |
| 8,297,088 | B1 * | 10/2012 | Zhang | G06F 1/182 |
| | | | | 70/164 |
| 9,057,479 | B2 * | 6/2015 | Lee | F16M 13/02 |
| 9,123,987 | B2 * | 9/2015 | Lettkeman | H01Q 1/1221 |
| 9,161,465 | B2 * | 10/2015 | Chen | H05K 5/0204 |
| 9,338,902 | B2 * | 5/2016 | Liu | F16M 11/22 |
| 9,714,529 | B1 * | 7/2017 | Conklin | H05K 5/0221 |
| 10,774,982 | B2 * | 9/2020 | Sung | H05K 5/0204 |
| 10,876,325 | B2 * | 12/2020 | Cheung | E05B 73/0005 |
| 11,098,844 | B1 * | 8/2021 | Lai | F16B 21/09 |

* cited by examiner

FIXING STRUCTURE FOR ELECTRONIC DEVICE

This application claims the benefit of U.S. provisional application Ser. No. 62/956,360, filed Jan. 2, 2020, the subject matter of which is incorporated herein by reference.

BACKGROUND OF THE INVENTION

Field of the Invention

The invention relates in general to a fixing structure used for an electronic device.

Description of the Related Art

The antenna calibration device can provide accurate information of azimuth angle, roll angle and tilt angle for antenna to ensure the best mobile radio coverage and minimum inter-cell interference. In addition, the antenna calibration device can provide sufficient ground images for clutter monitoring through the built-in full-HD camera, and provide video streaming services to display the images in front of the antenna sector of the application program.

However, the installation of the antenna calibration device is not easy, and manual errors are also occurred due to improper installation. Therefore, how to simplify the installation process of the antenna calibration device and improve the installation efficiency is an issue that the industries urgently want to solve.

SUMMARY OF THE INVENTION

The present invention relates to a fixing structure of an electronic device to simplify the installation process and improve the efficiency of the installation.

According to one aspect of the present invention, a fixing structure for an electronic device including a mounting body and a mounting bracket is provided. The mounting body includes a side surface, a bottom surface, and at least one limiting member disposed on the bottom surface. The limiting member includes a fixed end and a pillar. The pillar extends downward from the fixed end and protrudes from the bottom surface. The mounting bracket includes a fixing plate and a release assembly. The fixing plate is disposed under the bottom surface of the mounting body, and the fixing plate and the pillar are buckled with each other. The release assembly is disposed on the fixing plate, and the release assembly abuts against the side surface of the mounting body.

Other objects, features, and advantages of the invention will become apparent from the following detailed description of the preferred but non-limiting embodiments. The following description is made with reference to the accompanying drawings.

Figure 1:
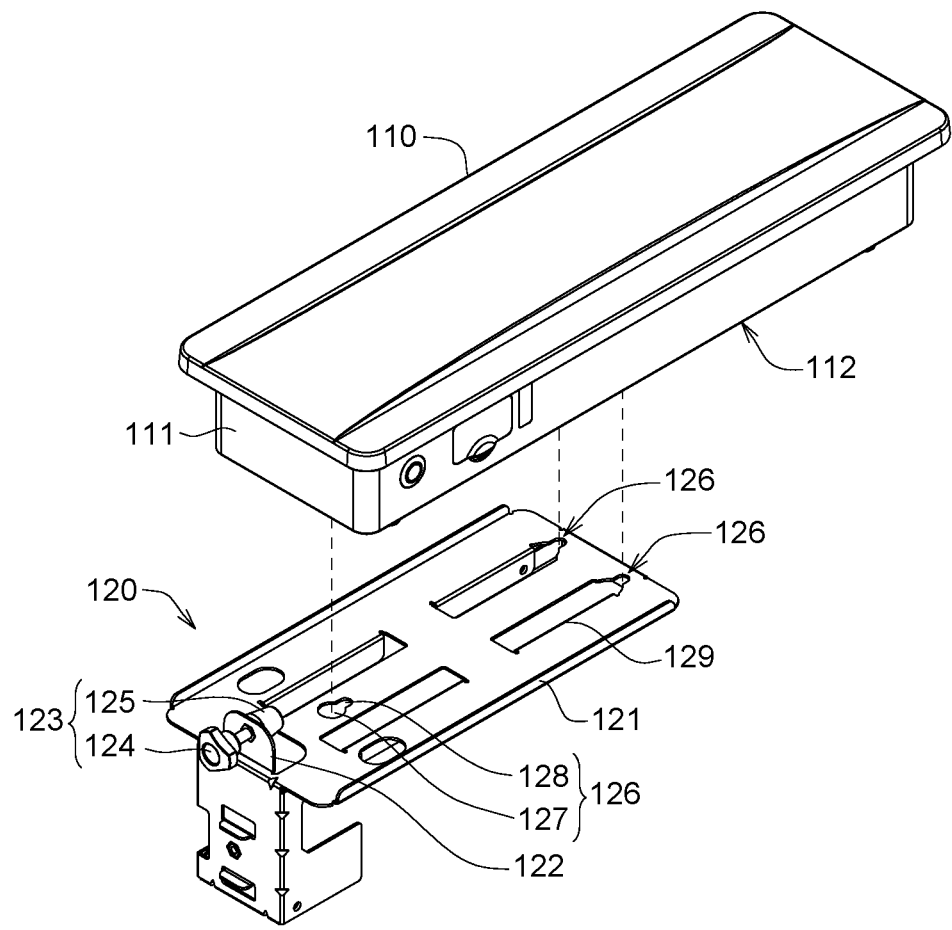
FIG. 1 is a schematic diagram of a fixing structure of an electronic device according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
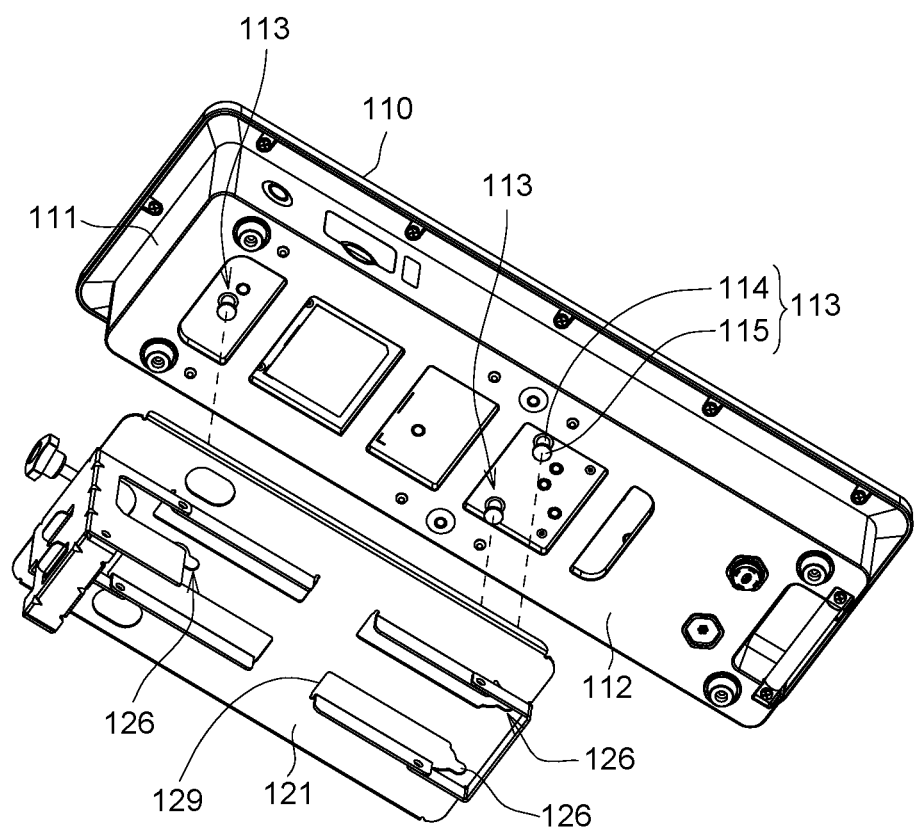
FIG. 2 is a schematic bottom view of the fixing structure of the electronic device of FIG. 1.
Figure 3:
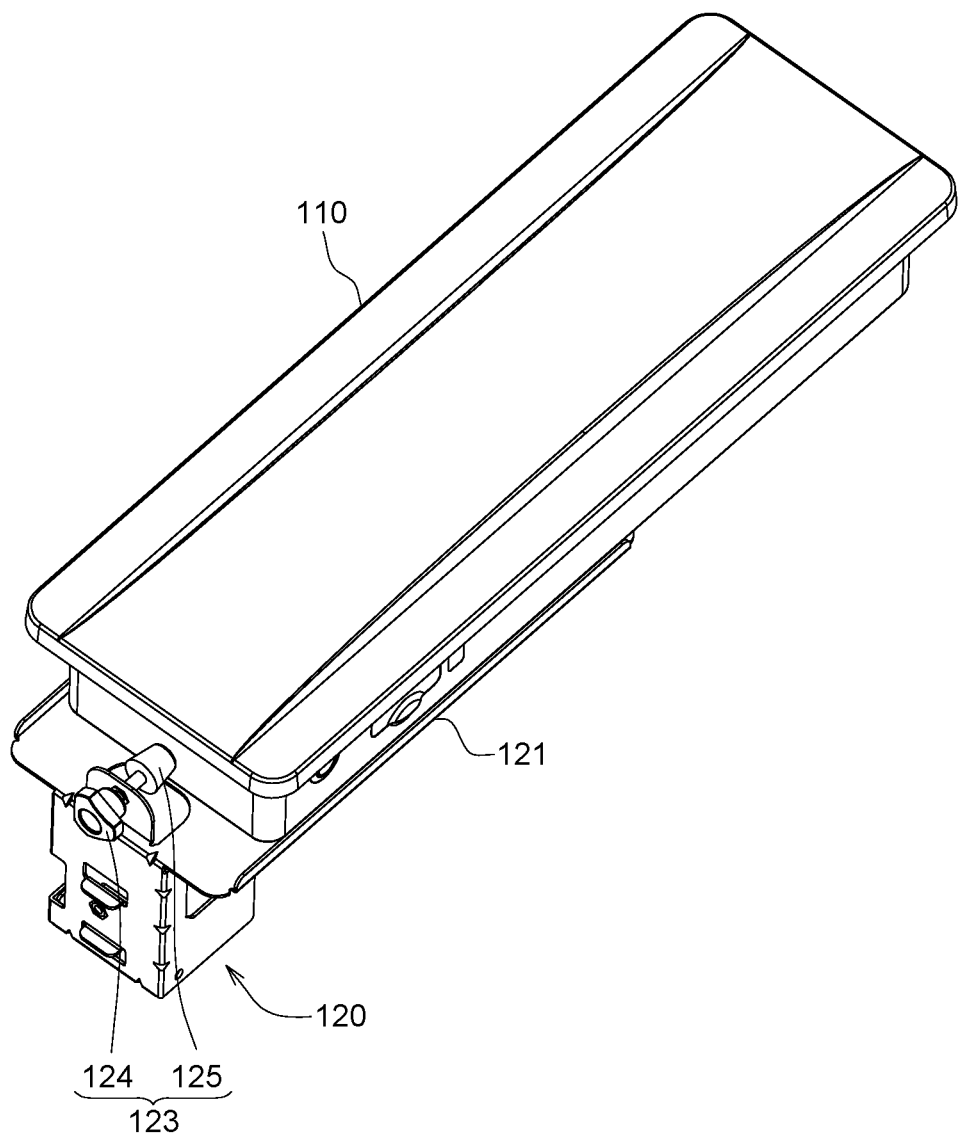
FIG. 3 is an assembly schematic diagram of the fixing structure of the electronic device of FIG. 1.
Figure 4:
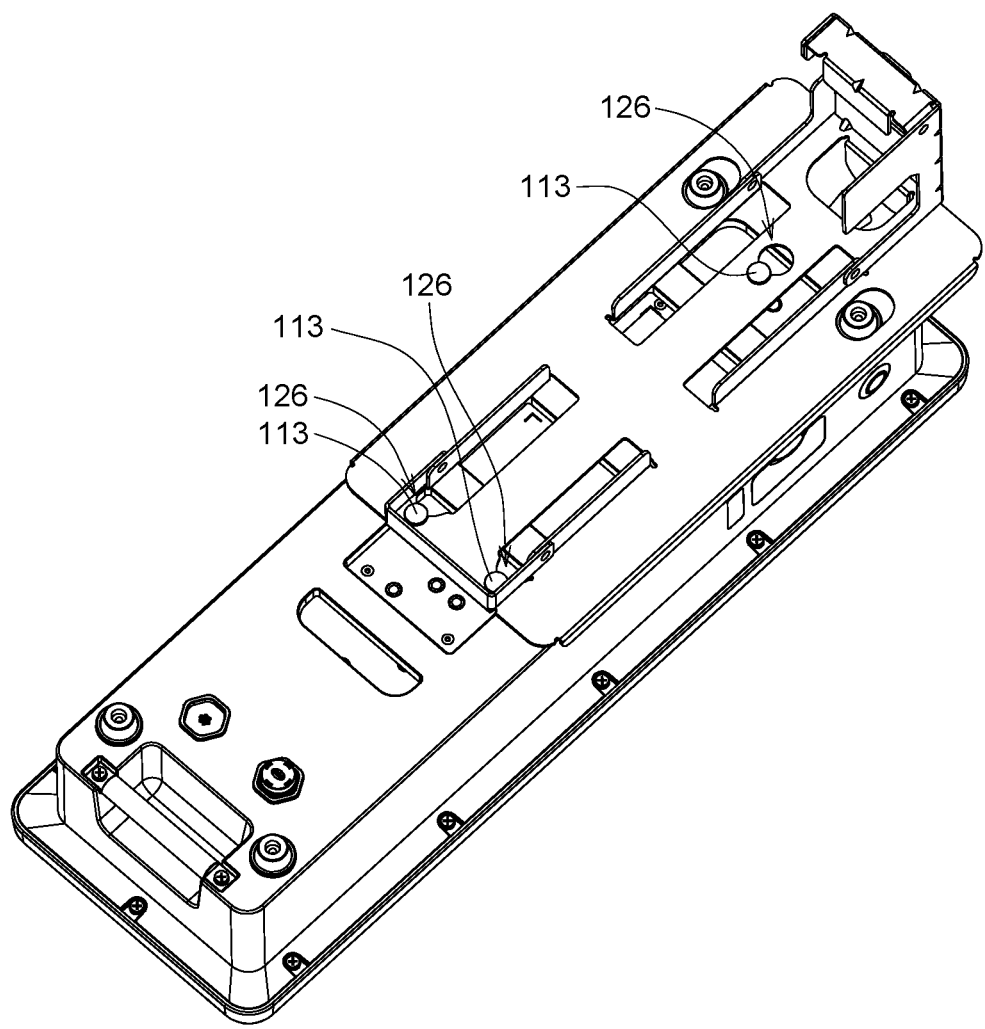
FIG. 4 is a schematic bottom view of the fixing structure of the electronic device of FIG. 3.
Figure 5:
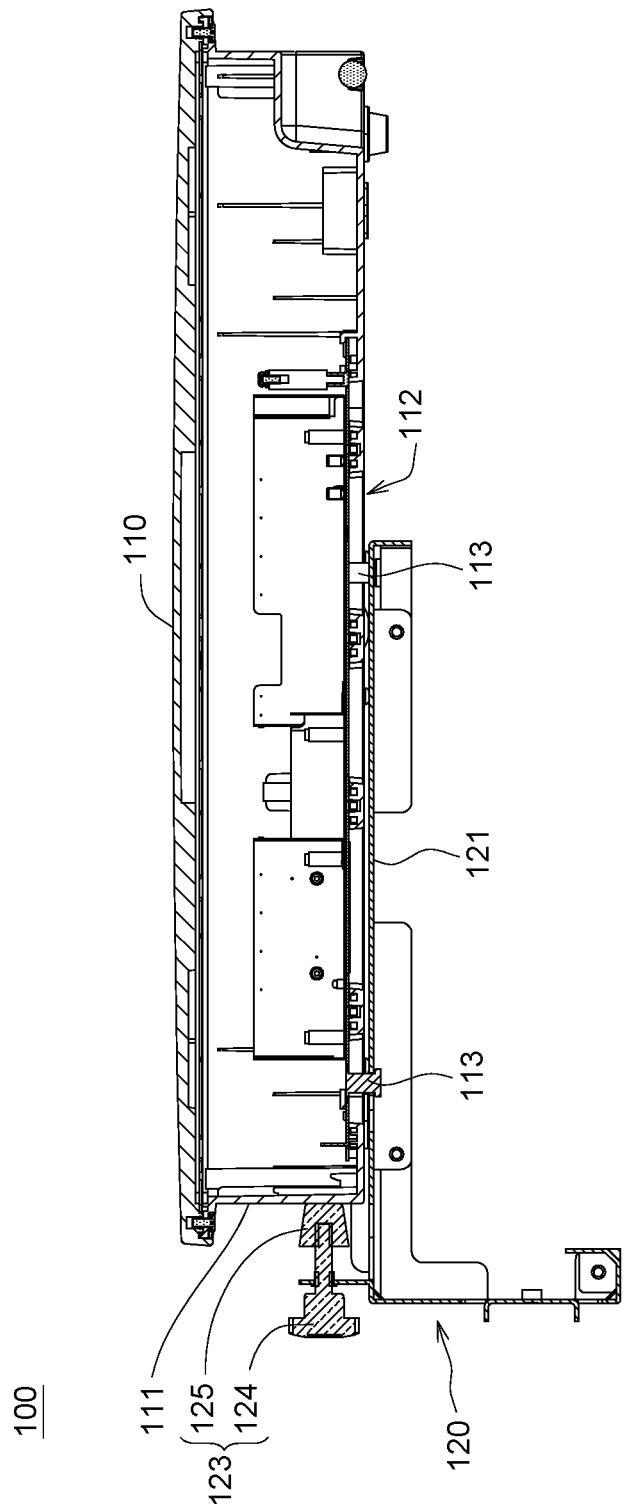
FIG. 5 is a schematic cross-sectional view of the fixing structure of the electronic device of FIG. 3.

Please refer to FIGS. 1 to 5. FIG. 1 is a schematic diagram of a fixing structure 100 of an electronic device according to an embodiment of the invention, and FIG. 2 is a schematic bottom view of the fixing structure 100 of an electronic device of FIG. 1. FIG. 3 is an assembly schematic diagram of the fixing structure 100 of the electronic device of FIG. 1, FIG. 4 is a schematic bottom view of the fixing structure 100 of the electronic device of FIG. 3, and FIG. 5 is a schematic cross-sectional view of the fixing structure 100 of the electronic device of FIG. 3.

According to an embodiment of the present invention, the fixing structure 100 of an electronic device includes a mounting body 110 and a mounting bracket 120. The mounting body 110 has, for example, a plastic casing for accommodating an electronic device. The mounting bracket 120 is, for example, a metal base for supporting the mounting body 110.

Referring to FIGS. 1 and 2, the mounting body 110 may include a side surface 111, a bottom surface 112, and at least one limiting member 113 disposed on the bottom surface 112. The mounting bracket 120 may include a fixing plate 121, a first side plate 122, a release assembly 123, and at least one slot hole 126 provided on the fixing plate 121, wherein the number and position of the slot hole 126 is corresponding to the number and position of the limiting member 113, so that each of the limiting member 113 can be accommodated in the corresponding slot hole 126. In an embodiment, the number of the limiting member 113 is, for example, three, and the number of the slot hole 126 is, for example, three.

Referring to FIG. 1, the slot hole 126 is, for example, a gourd hole. The slot hole 126 has a first aperture portion 127 on one side, and the slot hole 126 has a second aperture portion 128 on the other side. The size of the first aperture portion 127 is greater than the size of the second aperture portion 128. Refer to FIG. 2. The limiting member 113 includes a fixed end 114 and a pillar 115. The pillar 115 extends downward from the fixed end 114 and protrudes from the bottom surface 112. The pillar 115 is, for example, a T-shaped post. The flange size of the T-shaped post is greater than the size of the second aperture portion 128 but less than the size of the first aperture portion 127. The flange of the pillar 115 interferes with the second aperture portion 128 so that the pillar 115 can be positioned in the slot hole 126.

Referring to FIG. 4, the pillar 115 can pass through the slot hole 126 from the first aperture portion 127, and the pillar 115 can move into the second aperture portion 128 and be positioned in the second aperture portion 128. Therefore, the installation process can be simplified and the installation efficiency can be improved.

Referring to FIGS. 1 and 5, the fixing plate 121 is disposed under the bottom surface 112 of the mounting body 110, and the fixing plate 121 and the pillar 115 are buckled with each other. In addition, the release assembly 123 is disposed on the fixing plate 121, and the release assembly 123 abuts against the side surface 111 of the mounting body 110. Furthermore, the fixing plate 121 may further include at least one sliding groove 129, and the slot hole 126 is correspondingly disposed on a side of the sliding slot 129 relatively far away from the release assembly 123. In the present embodiment, the number of sliding grooves 129 is, for example, four, and the mounting body 110 can slide along the sliding grooves 129 to be positioned on the fixed plate 121, or slide in the opposite direction to release the positioning of the mounting body 110.

As shown in FIGS. 1 and 5, the slot hole 126 is located on the right side of the sliding groove 129, and the release assembly 123 is arranged on the first side plate 122 on the left side of the fixing plate 121. When the mounting body 110 moves from the left side of the sliding groove 129 to the right side of the sliding groove 129, the mounting body 110 can be positioned on the fixing plate 121. Then, the release assembly 123 includes a rod 124 and a buffer member 125. The rod 124 is used to apply a force to the buffer 125 so that the release assembly 123 abuts the side surface 111 of the mounting body 110. The buffer member 125 is made of, for example, a buffer material such as rubber or foam, and the rod 124 is, for example, a screw rod. The buffer member 125 is disposed at one end of the rod 124 to abut against the side surface 111 of the mounting body 110. The release assembly 123 does not limit to the screw rod used in the above embodiment, and other manners such as screw-less fasteners and buckles can also be used to achieve the same effect.

In an embodiment, the first side plate 122 is parallel to the side surface 111 of the mounting body 110 and is spaced a fixed distance from the side surface 111. The rod 124 is rotatably disposed on the first side plate 122 to generate a spiral path in the axial direction of the rod 124 and can moves between the first side plate 122 and the side surface 111 of the mounting body 110 to generate a lateral force so that the buffer member 125 can abut against the side surface 111 of the mounting body 110. Therefore, the mounting body 110 and the mounting bracket 120 do not need to be locked together with screws or other parts, and thus the installation process can be simplified and the installation efficiency can be improved.

Figure 6:
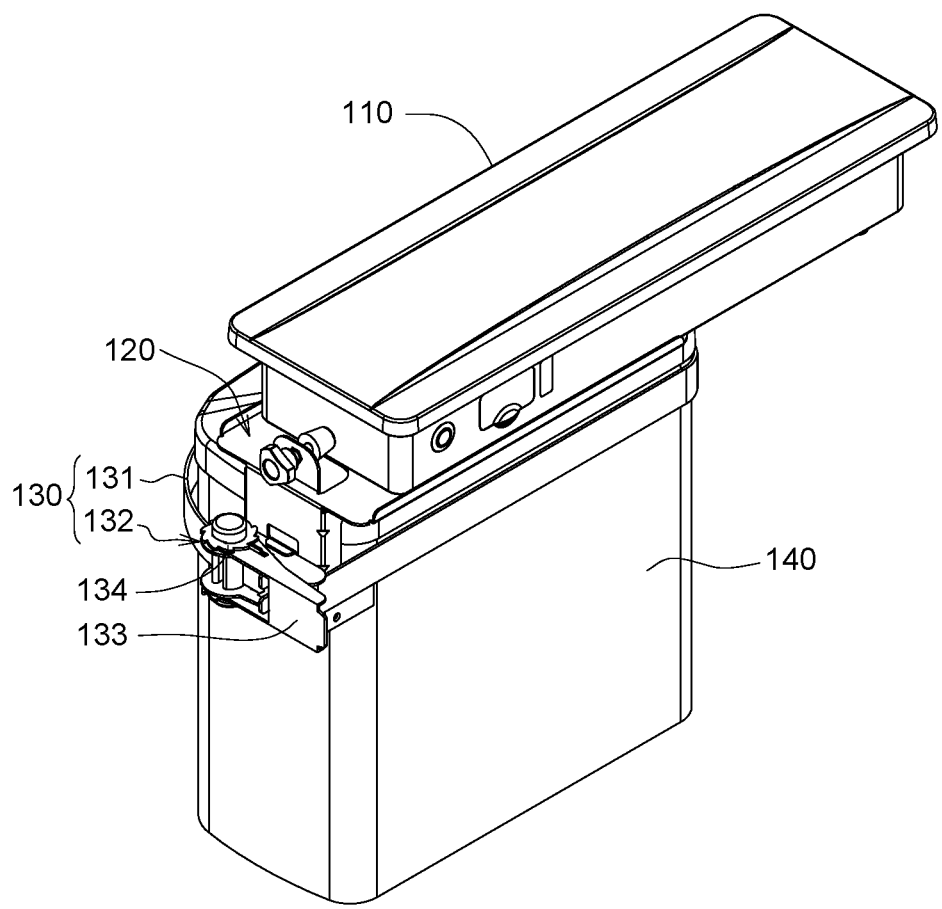
FIG. 6 is a schematic diagram of the fixing structure of the electronic device of FIG. 3 installed on the antenna body.

Please refer to FIG. 6. FIG. 6 is a schematic diagram of the fixing structure 100 of the electronic device of FIG. 3 installed on an antenna body 140. In an embodiment, the fixing structure 100 of the electronic device may further include an adjustable holder 130 to fasten the mounting bracket 120 to the antenna body 140. In other words, the antenna body 140 and the mounting bracket 120 are tied together with a ribbon (such as a strap 131), for example, and there is no need to lock the mounting bracket 120 with screws or other parts.

In an embodiment, the adjustable holder 130 includes, for example, a strap 131 and a tightener 132, the strap 131 surrounds the antenna body 140, and the tightener 132 includes a force applying portion 133 (such as a handle) and a ratchet wheel 134, the force applying portion 133 rotates the ratchet wheel 134, and the ratchet wheel 134 is used to adjust the tightness of the strap 131 so that the strap 131 is fastened to the antenna body 140. When the user wants to untie the strap 131, the user only needs to loosen the pawl that fixes the ratchet wheel 134. It is convenient to use, so that the installation process can be simplified and the installation efficiency can be improved.

The fixing structure of the above-mentioned embodiments of the present invention can be used in an electronic device, such as an antenna monitoring device, an antenna calibration device, or other electronic devices with other functions, so that errors occurred in manual installation can be reduced, the efficiency of installation and disassembly of the electronic device can be improved and the number of screws or locking parts can be reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fixed structure for an electronic device, comprising:
a mounting body, comprising a side surface, a bottom surface, and at least one limiting member disposed on the bottom surface, the limiting member comprising a fixed end and a pillar extending downward from the fixing end and protruding from the bottom surface;
a mounting bracket, comprising a fixing plate and a release assembly, the fixing plate being disposed under the bottom surface of the mounting body, the fixing plate and the pillar being buckled with each other, the release assembly being arranged on the fixing plate, and the release assembly abutting against the side surface of the mounting body; and
an adjustable holder for fastening the mounting bracket to an antenna body, wherein the adjustable holder comprises a strap and a tightener, the strap surrounds the antenna body, the tightener comprises a force applying portion and a ratchet wheel, the force applying part rotates the ratchet wheel, and the ratchet wheel is used to adjust a tightness of the strap so that the strap is fastened on the antenna body.

2. The fixing structure according to claim 1, wherein the fixing plate comprises at least one slot hole for accommodating the at least one limiting member corresponding to each other.

3. The fixing structure according to claim 2, wherein one side of the slot hole has a first aperture portion, and other side of the slot hole has a second aperture portion, and the pillar passes through the slot hole from the first aperture portion, and the pillar is movably positioned in the second aperture portion.

4. The fixing structure according to claim 3, wherein the slot hole is a gourd hole.

5. The fixed structure according to claim 3, wherein the pillar is a T-shaped post.

6. The fixing structure according to claim 5, wherein a size of a flange of the T-shaped post is less than a size of the first aperture portion and greater than a size of the second aperture portion.

7. The fixing structure according to claim 2, wherein the fixing plate comprises at least one sliding groove, and the slot hole is correspondingly disposed on a side of the sliding groove away from the release assembly.

8. The fixing structure according to claim 1, wherein the release assembly comprises a rod and a buffer member, and the buffer member is disposed at one end of the rod body for abutting against the side surface of the mounting body.

9. The fixing structure according to claim 8, wherein the release assembly is disposed on a first side plate of the fixing plate, the first side plate is parallel to the side surface of the mounting body, and the rod is rotatably arranged on the first side plate and movable between the first side plate and the side surface of the mounting body.

10. The fixing structure according to claim 1, wherein the mounting body and the mounting bracket are screwlessly attached together.

\* \* \* \* \*